United States Patent
Miyahara et al.

(10) Patent No.: US 6,612,232 B2
(45) Date of Patent: Sep. 2, 2003

(54) SCREEN PRINTER AND SCREEN PRINTING METHOD

(75) Inventors: Seiichi Miyahara, Fukuoka (JP); Michinori Tomomatsu, Fukuoka (JP); Kimiyuki Yamasaki, Fukuoka (JP); Kunihiko Tokita, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/056,585

(22) Filed: Jan. 24, 2002

(65) Prior Publication Data
US 2002/0117063 A1 Aug. 29, 2002

(30) Foreign Application Priority Data
Jan. 25, 2001 (JP) ......................... 2001-016654

(51) Int. Cl.[7] ............................. B41F 15/42; B41L 13/18
(52) U.S. Cl. ................... 101/123; 101/129; 427/282; 118/406
(58) Field of Search ................... 101/119, 120, 101/123, 124, 126, 129; 427/96, 272, 282, 376.2; 118/406, 213; 222/330

(56) References Cited
U.S. PATENT DOCUMENTS

| | | | | | |
|---|---|---|---|---|---|
| 4,665,723 | A | * | 5/1987 | Zimmer | 68/200 |
| 5,925,414 | A | * | 7/1999 | Buechele et al. | 427/282 |
| 6,132,510 | A | * | 10/2000 | Buechele et al. | 118/213 |
| 2001/0023645 | A1 | * | 9/2001 | Miyahara et al. | 101/123 |
| 2002/0038814 | A1 | * | 4/2002 | Mimura et al. | 228/256 |
| 2002/0088354 | A1 | * | 7/2002 | Miyahara et al. | 101/123 |

FOREIGN PATENT DOCUMENTS

GB 2 364 669 A * 2/2002

* cited by examiner

Primary Examiner—Leslie J. Evanisko
(74) Attorney, Agent, or Firm—RatnerPrestia

(57) ABSTRACT

A screen printer for printing paste on a board by sliding a squeegee head on a mask plate. A pushing plate pressurizes solder paste in the squeegee head, and pressurized paste is led to a paste container from both outer parts in a printing width direction inward towards a printing center through a solder dispensing hole provided on both ends of the paste container. This configuration allows to print in accordance with the time-line supply sequence, regardless of the printing width of the board to be printed. This screen printer thus prevents the degradation and the consequent need for disposal of solder paste due to its retention in the squeegee head for long periods.

18 Claims, 6 Drawing Sheets

SCREEN PRINTER AND SCREEN PRINTING METHOD

FIELD OF THE INVENTION

The present invention relates to screen printers and screen printing methods for printing paste such as solder paste and conductive paste onto a board.

BACKGROUND OF THE INVENTION

Screen printing is one method of printing paste such as solder paste or conductive paste onto a board during the electronic component mounting process. A mask plate provided with pattern holes on a printing area is placed on the board, and paste is printed onto the board through the pattern holes on the mask plate using a squeegee.

One known screen printing method is to use a sealed squeegee head. In ordinary screen printing, paste is directly provided on the mask plate. However, in screen printing using the sealed squeegee head, paste is stored in the squeegee head. Paste inside the squeegee head is pressurized, while an opening on the bottom face of the squeegee head provided as a paste contact face, directly contacts the mask plate. This allows paste to be dispensed through the opening on the squeegee head and into the pattern holes on the mask plate. Each pattern hole is filled with paste as the squeegee head slides across the mask plate.

However, the conventional screen printing using the sealed squeegee head has following disadvantages.

FIGS. 6A and 6B show a partial sectional view of the squeegee head in a conventional screen printer. In both Figures, sealed squeegee head 510 has tank 520 for storing solder paste 580. Pressurizing means extrudes solder paste 580 to paste container 530. Paste container 530 allows solder paste 580 to contact the surface of mask plate 550 through opening 540 created on its bottom face so that solder paste 580 is dispensed into the pattern holes.

The width of opening 540 is set to match the maximum printing width of board 560 to be printed. As shown in FIG. 6B, if the width of board 560 to be printed is narrow, only a portion of solder paste 580 in container 530 within the printing width is dispensed into the pattern holes on mask plate 550. Accordingly, if printing of board 560 with a narrow width continues, the remaining portion of solder paste 580 (the double hatched portion in FIG. 6B) supplied to paste container 530, which exceeds the board width, remains in the paste container 530 for a long period without being consumed in the printing process.

This remaining portion of solder paste 580 hardens and deteriorates as time passes, becoming unusable, requiring eventual disposal. A screen printer using a conventional sealed squeegee head thus retains a portion of solder paste due to the structure of the squeegee head and thus wastes solder.

SUMMARY OF THE INVENTION

The present invention solves the above disadvantage, and aims to offer a screen printer and a screen printing method that prevents the retention of deteriorating solder paste that eventually requires disposal.

The screen printer of the present invention prints paste on a board through pattern holes on a mask plate by sliding a squeegee head on the mask plate. The squeegee head includes:

(a) a paste feeder for supplying pressurized paste;

(b) a paste container for storing pressurized paste and making the paste contact the surface of the mask plate through an opening of a predetermined width created on its bottom face; and (c) a paste guide for leading the paste in the paste feeder to the paste container from both outer parts in the width direction inward towards the center.

The screen printing method of the present invention prints paste on the board through the pattern holes on the mask plate by sliding the squeegee head on the mask plate, and includes the steps of:

(a) supplying pressurized paste using a paste feeder in the squeegee head;

(b) storing pressurized paste in the paste container in the squeegee head, and making the paste contact the surface of the mask plate through an opening of a predetermined width created on the bottom face of the paste container;

(c) leading paste from the paste feeder to the paste container from both outer parts in the width direction inward towards the center; and (d) printing paste on the board in accordance with a time-series feeding sequence in Step (c).

The present invention thus prevents the degradation and the consequent need for disposal of paste due to its retention in the squeegee head for long periods.

DETAILED DESCRIPTION OF PREFERRED EMBODIMENT

Exemplary embodiments of the present invention are described below with reference to drawings.

First Exemplary Embodiment

Figure 1:
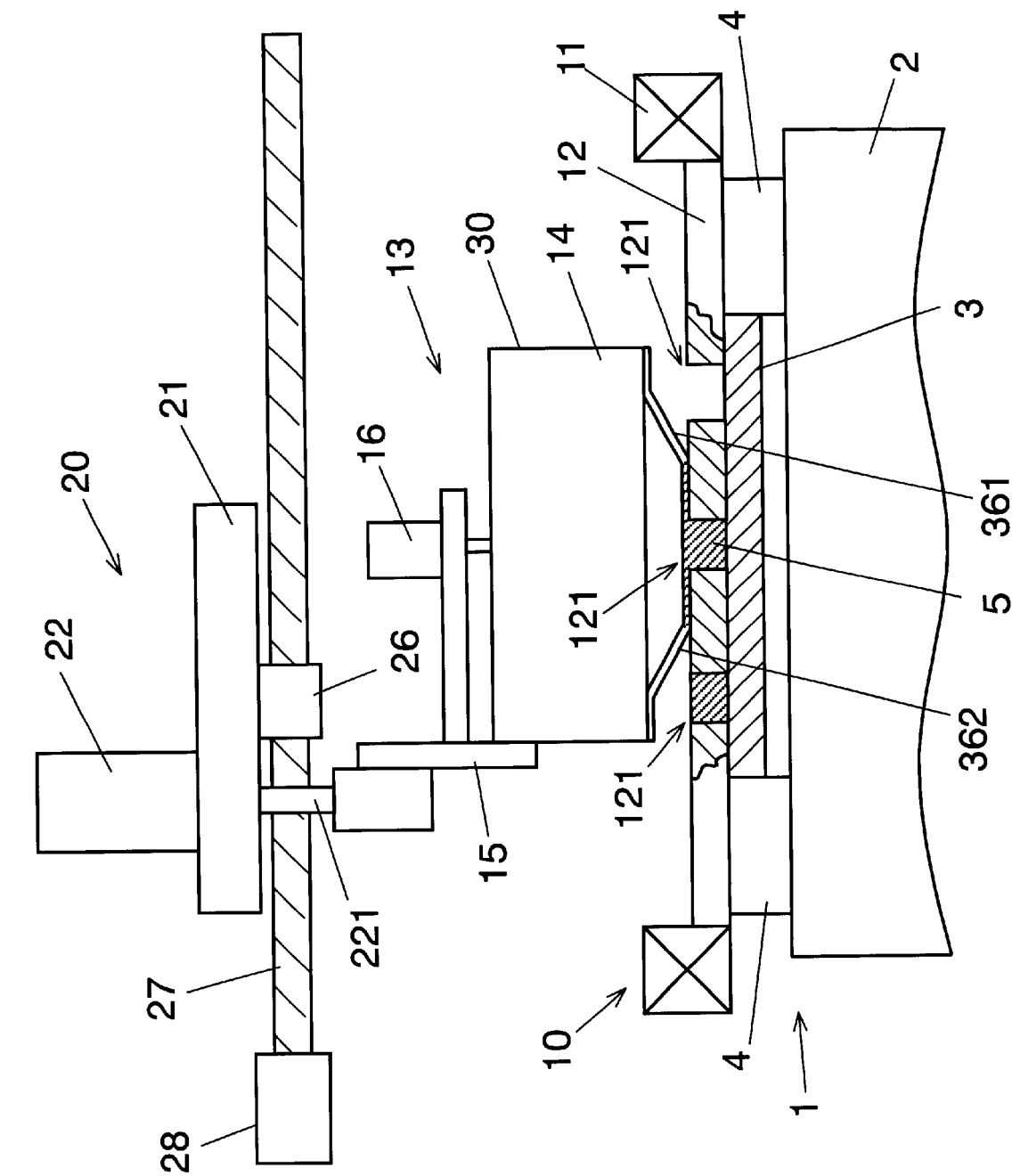
FIG. 1 is a front view of a screen printer in accordance with a first exemplary embodiment of the present invention.
Figure 2:
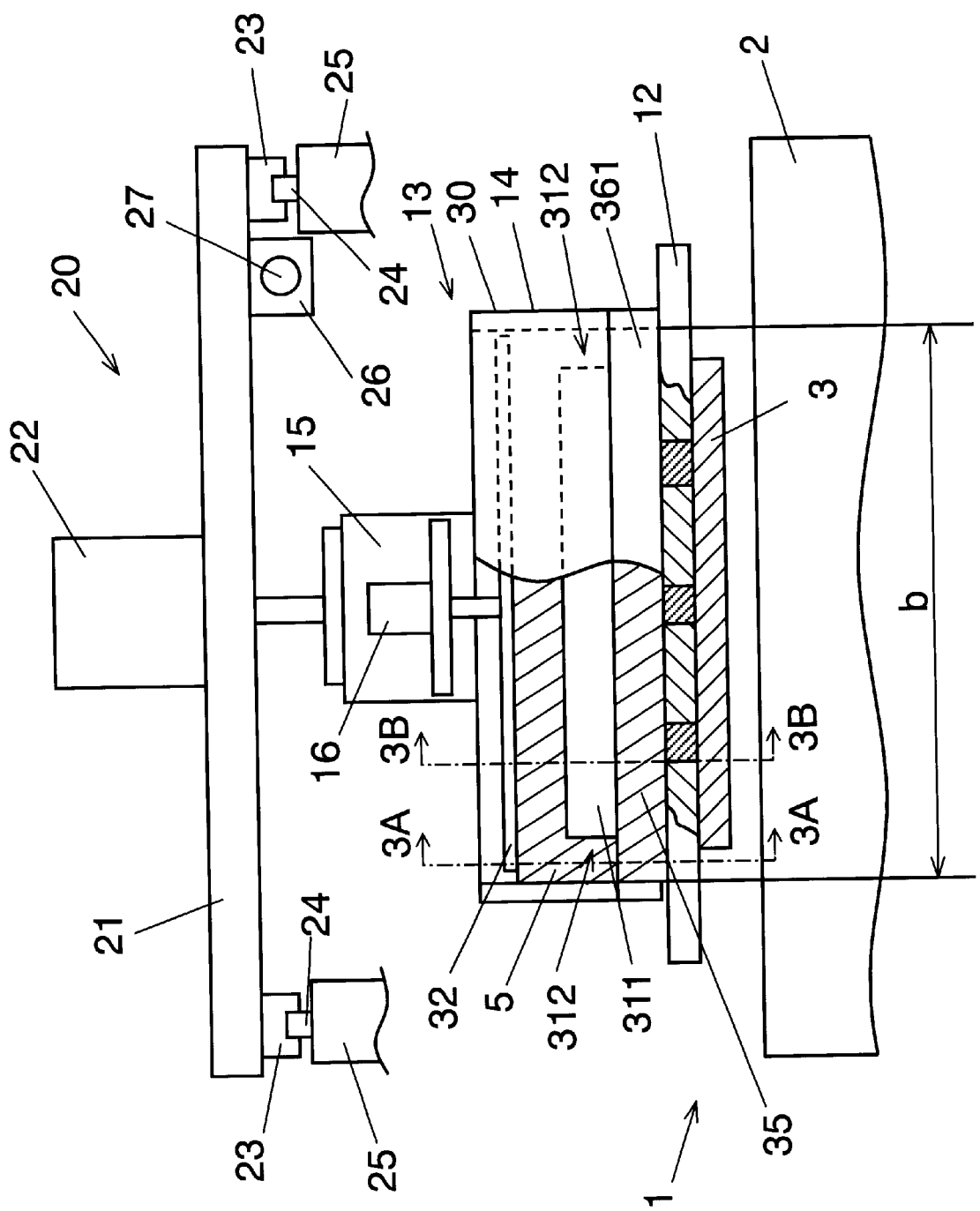
FIG. 2 is a side view of the screen printer in FIG. 1.
Figure 3A:
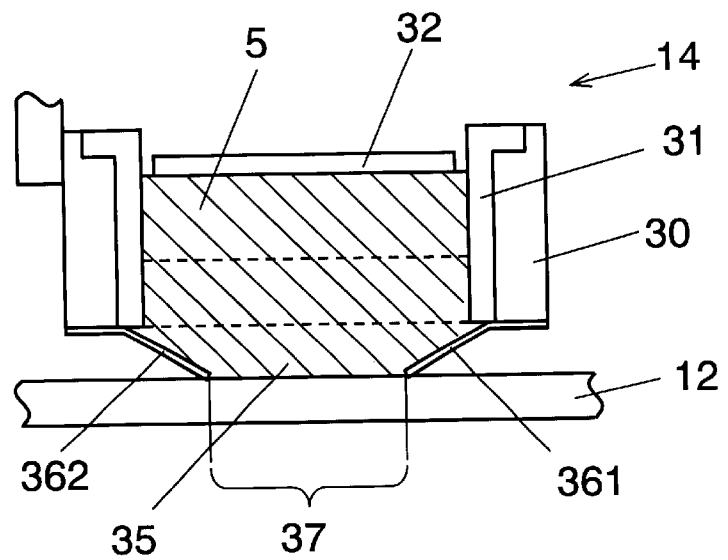
FIG. 3A is a partial sectional view of the squeegee head in the screen printer in FIG. 2 taken along Line 3A—3A in FIG. 2.
Figure 3B:
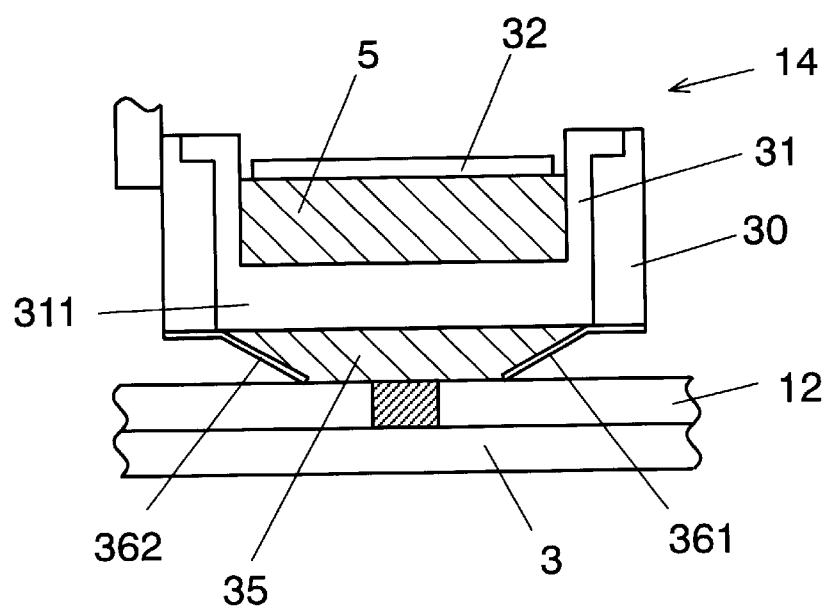
FIG. 3B is a partial sectional view of the squeegee head in the screen printer in FIG. 2 taken along Line 3B—3B in FIG. 2.
Figure 4A:
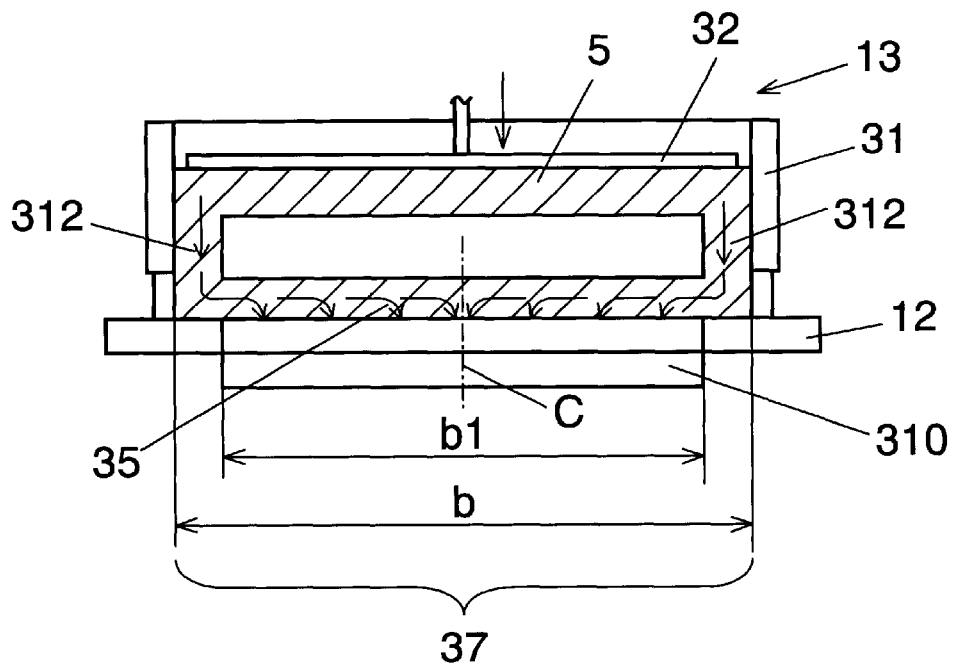
FIGS. 4A and 4B are explanatory charts illustrating the flow of solder paste during printing in the screen printer in FIG. 1.
Figure 4B:
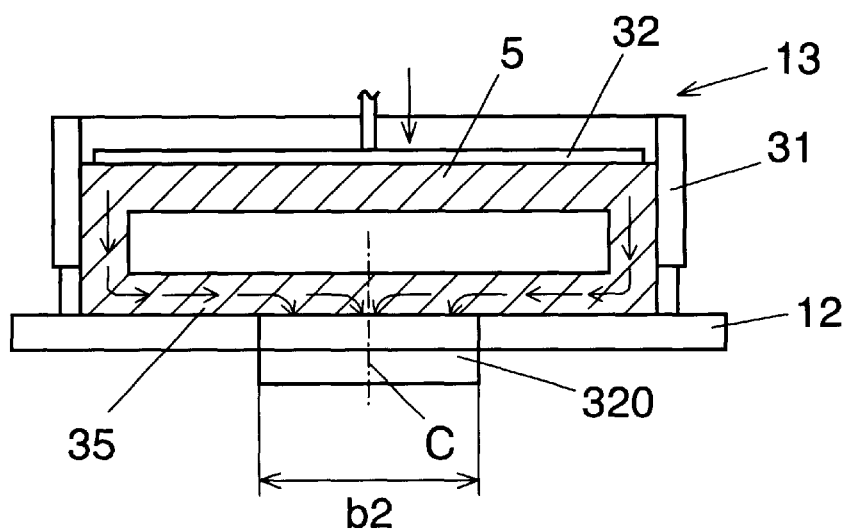

FIG. 1 is a front view of a screen printer in a first exemplary embodiment of the present invention. FIG. 2 is a side view of the screen printer in FIG. 1. FIG. 3A is a sectional view taken along Line 3A—3A, and FIG. 3B is a sectional view taken along Line 3B—3B in FIG. 2. FIGS. 4A and 4B are charts illustrating the flow of solder paste during printing using the screen printer in FIG. 1.

First, the structure of the screen printer is described with reference to FIGS. 1 and 2.

In both figures, board positioner 1 has board retainer 2 on a transfer table (not illustrated). Board 3 to be printed is secured with damper 4 of retainer 2. Board 3 is positioned horizontally and vertically by driving the transfer table.

Screen mask 10 is disposed over positioner 1. This mask 10 is configured with mask plate 12 attached to holder 11. Pattern hole 121 is created in mask plate 12 at the position to be printed on board 3.

Squeegee head 13 is disposed over mask 10 in vertically movable fashion with head elevator 20. Head elevator 20 has cylinder 22 standing upright on plate member 21. Squeegee head 13 is attached to the lower end of rod 221 of cylinder 22 via coupling member 15. Head 13 elevates against mask plate 12, propelled by driving cylinder 22. Head elevator 20 is thus an elevating means for raising and lowering head 13 against screen mask 10.

Slider 23 is fixed onto both ends of the bottom face of plate member 21. Slider 23 is slidably fitted to guide rail 24 disposed on frame 25. Nut 26 is attached to the bottom face of plate member 21. Feeding screw 27 screwed onto this nut 26 is driven by motor 28.

Plate member 21 moves horizontally via feeding screw 27, propelled by driving motor 28. Therefore, head 13 connected to head elevator 20 also moves horizontally. Head 13 thus moves horizontally on mask plate 12, propelled by driving motor 28, while head 13 is at its low position. In other words, motor 28, nut 27 and nut 26 comprise a transfer means for moving head 13 horizontally on mask plate 12.

Head 13 is provided with printing unit 14 which fills pattern hole 121 with solder paste 5 by contacting the surface of mask plate 12. Printing unit 14 has main frame 30 which is a block member longer in the width direction of mask plate 12. The width of main frame 30 is set to cover the width of board 3 to be printed as shown in FIG. 2.

FIGS. 3A and 3B are sectional views taken along Lines 3A—3A and 3B—3B in FIG. 2.

Main frame 30 has a cavity into which cartridge 31 storing solder paste 5 is detachably mounted. Cartridge 31 is a solder paste container for storing a predetermined volume of solder paste, and is mounted on main frame 30 during printing. Pushing plate 32 for pushing solder 5 inside cartridge 31 is fitted to an opening on a top face of cartridge 31. As shown in FIG. 2, pushing plate 32 is connected to a rod of cylinder 16 disposed over pushing plate 32. Pushing plate 32 moves vertically inside cartridge 31, propelled by driving cylinder 16. Solder 5 inside cartridge 31 is pressurized by pushing plate 32 downward using cylinder 16.

As shown in FIG. 2, solder dispensing hole 312 is provided on both sides (refer to Section 3A—3A) of bottom plate 311 configuring the bottom face of cartridge 31. This hole 312 is disposed at both ends of the direction in which squeegee head 13 moves during printing (printing width). Solder 5 inside cartridge 31 pressurized by pushing plate 32 is supplied downward through hole 312. Cylinder 16, pushing plate 32, and cartridge 31 thus form a solder paste feeding means for supplying pressurized solder paste 5.

Solder 5 passes through hole 312 and reaches paste container 35 which is a space created at the lower part of main frame 30. Paste container 35, as shown in FIG. 3A, is configured such that it is surrounded by two tapered scrapers 361 and 362, disposed to the bottom face of main frame 30, and the bottom face of main frame 30. This bottom face of paste container 35 is opening 37 (see FIG. 3A) for making solder 5 contact mask plate 12. Opening width b of this opening 37 is set in line with the maximum printing width of the board to be printed.

Scrapers 361 and 362 form the front and back walls in the squeezing direction of paste container 35. The bottom end of these scrapers 361 and 362 contact the surface of mask plate 12 when squeegee head 13 is lowered. During printing, container 35 stores pressurized solder 5, and makes solder 5 contact mask plate 12 through opening 37 between scrapers 361 and 362.

When pressurized solder 5 is fed from cartridge 31 to container 35, solder 5 is fed through hole 312. Accordingly, solder 5 is always fed from both ends of the printing width to the center. More specifically, hole 312 acts as a paste guide for guiding solder paste from both ends in the printing width direction toward the center to container 35.

Next, the printing operation of squeegee head 13 is described.

First, head 13 is lowered until its bottom face contacts the top face of mask plate 12.

Then, head 13 slides on mask plate 12 while solder paste 5 is pressurized in cartridge 31 by pushing plate 32.

The above operation dispenses solder 5 from paste container 35 into pattern hole 121 of mask plate 12 through opening 37, and thus solder is printed on board 3.

FIGS. 4A and 4B are charts illustrating the flow of solder paste during printing using the screen printer in FIG. 1. With reference to both Figures, the flow of solder paste 5 during printing is described below.

FIG. 4A shows the case where board 310 to be printed has printing width b1 equivalent to opening width b of opening 37. FIG. 4B shows the case where board 320 to be printed has printing width b2 smaller than b1 in FIG. 4A.

In the example shown in FIG. 4A, solder paste 5, pressurized by pushing plate 32, passes through solder dispensing hole 312 into paste container 35, and is then extruded into pattern hole 121 on mask plate 12 over almost the entire opening width b. Accordingly, solder 5 is uniformly consumed over the entire width of opening 37 from container 35, eliminating the risk that solder 5 remains unconsumed in container 35 for a long period.

In FIG. 4B, solder 5 is extruded into pattern hole 121 in an area of printing width b2 smaller than opening width b, and solder 5 out of printing width b2 is not consumed by being directly extruded into pattern hole 121. However, squeegee head 13 in the first exemplary embodiment supplies pressurized solder 5 into container 35 through solder dispensing hole 312. This enables solder 5 to always be guided from both ends in the printing width to printing center C in container 35. Solder around center C is always consumed during printing, regardless of the board width.

Accordingly, solder 5 supplied to container 35 is always used for printing in accordance with the time-line supply sequence, regardless of the printing width of the board to be printed. This prevents solder 5 from remaining unconsumed in container 35 for long periods, which is the case in the prior art, during which time the solder deteriorates in the container. The present invention thus prevents wastage of resources by reducing the volume of solder that deteriorates and requires disposal.

Second Exemplary Embodiment

Figure 5:
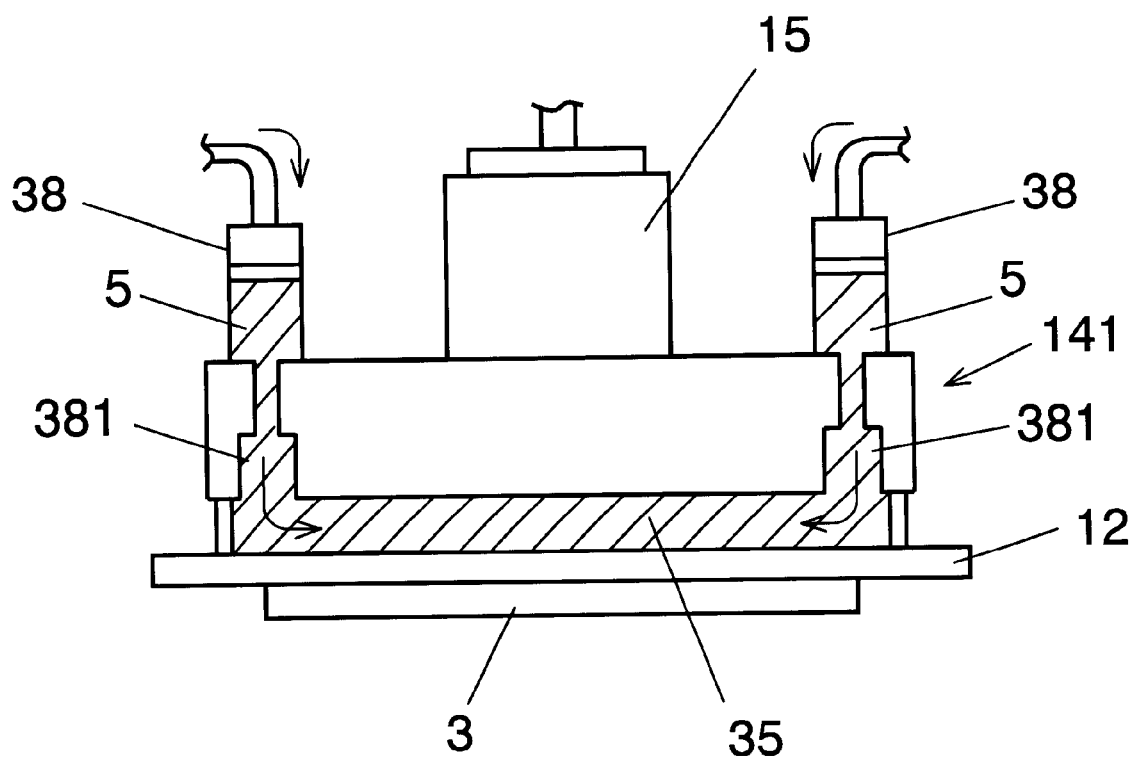
FIG. 5 is a partial sectional view of a squeegee head in a screen printer in accordance with a second exemplary embodiment of the present invention.
Figure 6A:
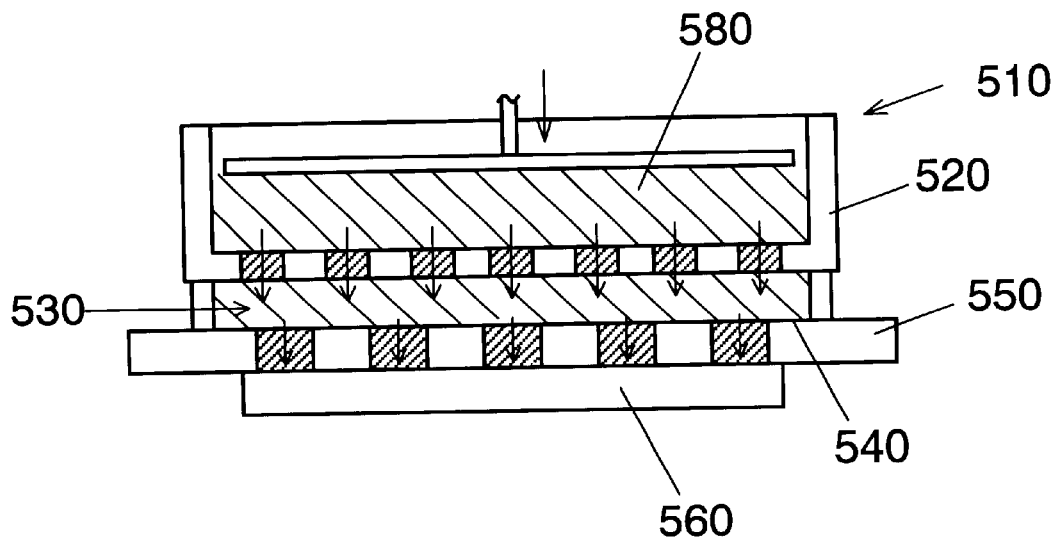
FIGS. 6A and 6B is a partial sectional views of a squeegee head in a conventional screen printer.
Figure 6B:
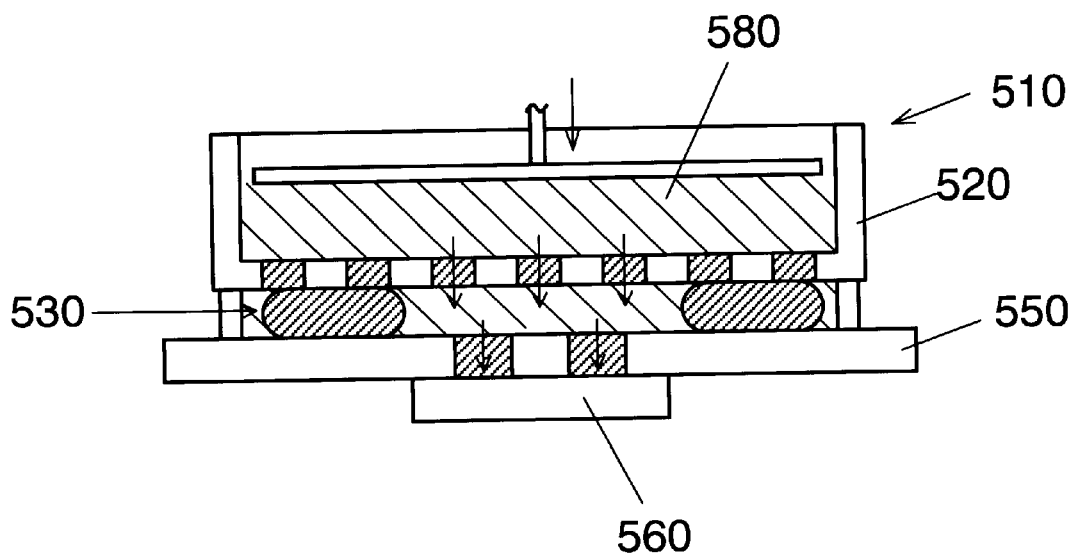

FIG. 5 is a partial sectional view of a squeegee head of a screen printer in a second exemplary embodiment of the present invention. In the first exemplary embodiment, pushing plate 32 is used for pressurizing solder 5 inside cartridge 31 as paste feeding means for supplying pressurized solder paste 5 to paste container 35. In the second exemplary embodiment, as shown in FIG. 5, two syringes 38 are provided in printing unit 141 at both ends in the printing direction of paste container 35, disposed in the same way as the first exemplary embodiment, for pressurizing and dispensing solder 5.

In this configuration, solder 5 is pressurized by air pressure in syringes 38 for guiding solder 5 from both ends in the printing width to the printing center into paste container 35 through guiding hole 381. In the second exemplary embodiment, syringe 38 acts as a paste feeding means and guiding hole 381 acts as a paste guiding means. It is apparent that syringes 38 which act as paste feeding means may be disposed independently of printing unit 141, and may feed pressurized solder paste through a channel such as a tube or pipe. The present invention is thus applicable as long as pressurized solder paste is guided from both ends in the printing width to printing center into the paste container.

Accordingly, the present invention guides pressurized paste fed from a paste feeding means into the paste container from both ends of the printing width to the printing center. This ensures a constant consumption of paste for printing in accordance with the time-line feeding sequence, regardless of the printing width of the board to be printed. The present invention thus prevents the accumulation of deteriorating paste in the squeegee head for long periods that ultimately requires disposal.

What is claimed is:

1. A screen printer which prints paste on a board through a pattern hole on a mask plate by sliding a squeegee head on the mask plate, said squeegee head comprising:
   (a) a paste feeder for supplying pressurized paste;
   (b) a paste container for storing said pressurized paste and making said paste contact a surface of the mask plate through an opening of a predetermined width created on a bottom face of said paste container, said paste container having two outer parts and a center;
   (c) a plate located between the paste feeder and the paste container, the plate having two ends; and
   (d) a paste guide for leading said paste supplied from said paste feeder, past the two ends of the plate, to the two outer parts of said paste container, and inward towards said center.

2. The screen printer as defined in claim 1, wherein said paste feeder is a cartridge filled with paste.

3. The screen printer as defined in claim 1, wherein said paste feeder is a syringe which pressurizes and dispenses paste, said syringe being disposed at both ends of said squeegee head.

4. The screen printer as defined in claim 1, wherein said paste guide is a dispensing hole provided at the two ends of the plate.

5. A screen printing method for printing paste on a board through a pattern hole on a mask plate by sliding a squeegee head on the mask plate, said method comprising the steps of:
   (a) supplying pressurized paste using a paste feeder in said squeegee head;
   (b) storing said pressurized paste in a paste container in said squeegee head, and making said paste contact a surface of the mask plate through an opening of a predetermined width created on a bottom face of said paste container; and
   (c) leading said paste from said paste feeder to said paste container from two outer parts of the paste container, past two ends of a plate between the paste feeder and the paste container, and inward towards a center of the paste container.

6. The screen printing method as defined in claim 5, wherein said paste feeder is a cartridge filled with said paste.

7. The screen printing method as defined in claim 5, wherein said paste feeder is a syringe for pressurizing and dispensing said paste, said syringe being provided on both ends of said squeegee head.

8. A printer for printing paste on a board comprising:
   (a) a paste feeder for supplying pressurized paste;
   (b) a paste container for storing the paste, said paste container having two outer parts and a center;
   (c) a plate located between the paste feeder and the paste container; and
   (d) means for guiding the paste from said paste feeder, past the plate, to said paste container from said two outer parts towards the center.

9. The printer as defined in claim 8, further comprising means to pressurize the paste.

10. The printer as defined in claim 8, wherein the paste container has a bottom face and an opening in the bottom face.

11. The printer as defined in claim 8, wherein the paste feeder is a cartridge filled with paste.

12. The printer as defined in claim 8, wherein the paste feeder is a syringe which pressurizes the paste.

13. The printer as defined in claim 8, wherein the means for guiding the paste is at least one dispensing hole.

14. The printer as defined in claim 8, wherein the paste container includes means for making the paste contact a surface of a mask.

15. A printing method for printing paste on a board, said method comprising the steps of:
   (a) storing paste in a paste container having two outer parts and a center;
   (b) using a paste feeder to supply the paste;
   (c) guiding said paste from said paste feeder, past a plate located between the paste feeder and the paste container, and to said paste container from said two outer parts towards the center.

16. The printing method of claim 15, including the step of printing the paste on a board.

17. The printing method of claim 15, wherein the paste feeder is a cartridge filled with said paste.

18. The printing method of claim 15, wherein the paste feeder is a syringe for pressurizing and dispensing the paste.

* * * * *